United States Patent
Palmer (10) Patent No.: US 10,923,202 B2
(45) Date of Patent: Feb. 16, 2021

(54) HOST-RESIDENT TRANSLATION LAYER TRIGGERED HOST REFRESH

(71) Applicant: Micron Technology, Inc., Boise, ID (US)

(72) Inventor: David Aaron Palmer, Boise, ID (US)

(73) Assignee: Micron Technology, Inc., Boise, ID (US)

(*) Notice: Subject to any disclaimer, the term of this patent is extended or adjusted under 35 U.S.C. 154(b) by 5 days.

(21) Appl. No.: 16/054,109

(22) Filed: Aug. 3, 2018

(65) Prior Publication Data

US 2020/0043561 A1 Feb. 6, 2020

(51) Int. Cl.
| | |
|---|---|
| *G11C 7/00* | (2006.01) |
| *G11C 16/34* | (2006.01) |
| *G11C 16/28* | (2006.01) |
| *H01L 27/115* | (2017.01) |
| *G11C 11/56* | (2006.01) |
| *G11C 16/10* | (2006.01) |

(52) U.S. Cl.
CPC ...... *G11C 16/3431* (2013.01); *G11C 11/5635* (2013.01); *G11C 16/10* (2013.01); *G11C 16/28* (2013.01); *H01L 27/115* (2013.01)

(58) Field of Classification Search
CPC ..... G11C 16/3431; G11C 16/10; G11C 16/28; G11C 11/5635; G06F 12/10; H01L 27/115
See application file for complete search history.

(56) References Cited

U.S. PATENT DOCUMENTS

| | | | |
|---|---|---|---|
| 9,519,578 B1 | 12/2016 | Kuzmin et al. | |
| 10,424,388 B2 * | 9/2019 | Oh | G11C 29/028 |
| 10,459,845 B1 * | 10/2019 | Cariello | G06F 12/10 |
| 2010/0082890 A1 * | 4/2010 | Heo | G06F 12/0246 |
| | | | 711/103 |
| 2010/0262765 A1 * | 10/2010 | Cheon | G06F 3/0613 |
| | | | 711/103 |
| 2013/0179647 A1 * | 7/2013 | Park | G06F 12/0238 |
| | | | 711/154 |
| 2013/0326121 A1 | 12/2013 | Cheng | |
| 2014/0164677 A1 | 6/2014 | Borchers et al. | |
| 2015/0206584 A1 | 7/2015 | Tsai et al. | |
| 2016/0266818 A1 | 9/2016 | Lin et al. | |
| 2017/0109089 A1 | 4/2017 | Huang | |
| 2017/0177497 A1 | 6/2017 | Chun et al. | |

(Continued)

FOREIGN PATENT DOCUMENTS

WO   WO-2020028804 A1   2/2020

OTHER PUBLICATIONS

Wookhan, Jeong, et al., "Improving Flash Storage Performance by Caching Address Mapping Table in Host Memory", (Jul. 2017), 6 pgs.

(Continued)

*Primary Examiner* — Toan K Le
(74) *Attorney, Agent, or Firm* — Schwegman Lundberg & Woessner, P.A.

(57) ABSTRACT

Devices and techniques are disclosed herein for verifying host generated physical addresses at a memory device during a host performance boost mode of operation to ameliorate erroneous or potentially malicious access to the memory device, and efficiently providing refreshed mapping information to the host during the host performance boost mode of operation.

20 Claims, 4 Drawing Sheets

(56) References Cited

U.S. PATENT DOCUMENTS

| | | |
|---|---|---|
| 2017/0192902 A1 | 7/2017 | Hwang et al. |
| 2019/0004944 A1* | 1/2019 | Widder et al. |
| 2019/0121576 A1* | 4/2019 | Jean ..................... G06F 3/0616 |
| 2019/0258567 A1 | 8/2019 | Kim et al. |
| 2019/0287632 A1* | 9/2019 | Asano ................ G11C 16/3431 |
| 2020/0042436 A1 | 2/2020 | Palmer |

OTHER PUBLICATIONS

"International Application Serial No. PCT/US2019/044909, International Search Report dated Nov. 15, 2019", 4 pgs.
"International Application Serial No. PCT/US2019/044909, Written Opinion dated Nov. 15, 2019", 4 pgs.

* cited by examiner

HOST-RESIDENT TRANSLATION LAYER TRIGGERED HOST REFRESH

BACKGROUND

Memory devices are typically provided as internal, semiconductor, integrated circuits in computers or other electronic devices. There are many different types of memory including volatile and non-volatile memory. Volatile memory can require power to maintain data and includes random-access memory (RAM), dynamic random-access memory (DRAM), and synchronous dynamic random-access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random-access memory (RRAM), and magnetoresistive random access memory (MRAM), 3D XPoint™ memory, among others.

Memory cells are typically arranged in a matrix or an array. Multiple matrices or arrays can be combined into a memory device, and multiple devices can be combined to form a storage volume of a memory system, such as a solid-state drive (SSD), a Universal Flash Storage (UFS™) device, a MultiMediaCard (MMC) solid-state storage device, an embedded MMC device (eMMC™), etc.

A memory system can include one or more processors or other memory controllers performing logic functions to operate the memory devices or interface with external systems. The memory matrices or arrays can include a number of blocks of memory cells organized into a number of physical pages. The memory system can receive commands from a host in association with memory operations, such as read or write operations to transfer data (e.g., user data and associated integrity data, such as error data and address data, etc.) between the memory devices and the host, erase operations to erase data from the memory devices, or perform one or more other memory operations.

Memory is utilized as volatile and non-volatile data storage for a wide range of electronic applications, including, for example, personal computers, portable memory sticks, digital cameras, cellular telephones, portable music players such as MP3 players, movie players, and other electronic devices. Memory cells can be arranged into arrays, with the arrays being used in memory devices.

Many electronic devices include several main components: a host processor (e.g., a central processing unit (CPU) or other main processor); main memory (e.g., one or more volatile or non-volatile memory device, such as dynamic RAM (DRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, or combination of volatile and non-volatile memory, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Flash memory based storage devices such as NAND memory can use a Flash Translation Layer (FTL) to translate logical addresses of I/O requests, often referred to as logical block addresses (LBAs), to corresponding flash memory addresses which are stored in one or more FTL mapping tables. LBAs can be the logical addresses used by a host for managing data. Mobile storage devices typically have a cache with constrained size, and thus often lack memory to store an entire mapping table. Therefore, portions of the mapping table(s) can be retrieved from the flash memory on demand, which can cause random read performance degradation.

In order to improve random read performance, techniques described herein enable use of host-resident memory, in addition to memory cells of a memory device coupled to the host, as a cache for a FTL mapping table. Under a host-resident FTL, FTL data can be read from host memory faster than from flash memory, and the host can initiate a memory operation by retrieving a physical address (PA) of the flash memory and including the PA in a memory request to the flash memory. The PA can be retrieved by the host using the FTL memory cache of the host and the LBA of the host. Upon receiving the memory request, the flash memory system can immediately retrieve the data associated with the physical address without the delay associated with accessing the flash memory-based mapping table and using the LBA to obtain the physical address.

In certain implementations of a host-resident FTL, improvements in random read workload performance can be significant. However, the present inventors have identified techniques for host-resident FTL that can assist in validating the integrity of host memory requests, can assist in maintaining coherency between the host FTL table and the actual flash mapping table, and can assist in providing timely updates to the host FTL table while host-triggered memory operations are at or near idle. Straightforward implementations of host-resident FTL can assume that the mapping table remains accurate between host initiated operations. However, the memory system or memory device connected to the host often performs housekeeping operations such a garbage collection and wear leveling in between host initiated operations or during times when the host is idle. Housekeeping operations move data around and often revise and update, the mapping table resident at the memory device. Without some validity checks, straight forward implementation of host-resident FTL, such as a memory system blindly using the host-provided PA to access flash data, can often result in the memory system accessing flash memory at the wrong PA.

Figure 1:
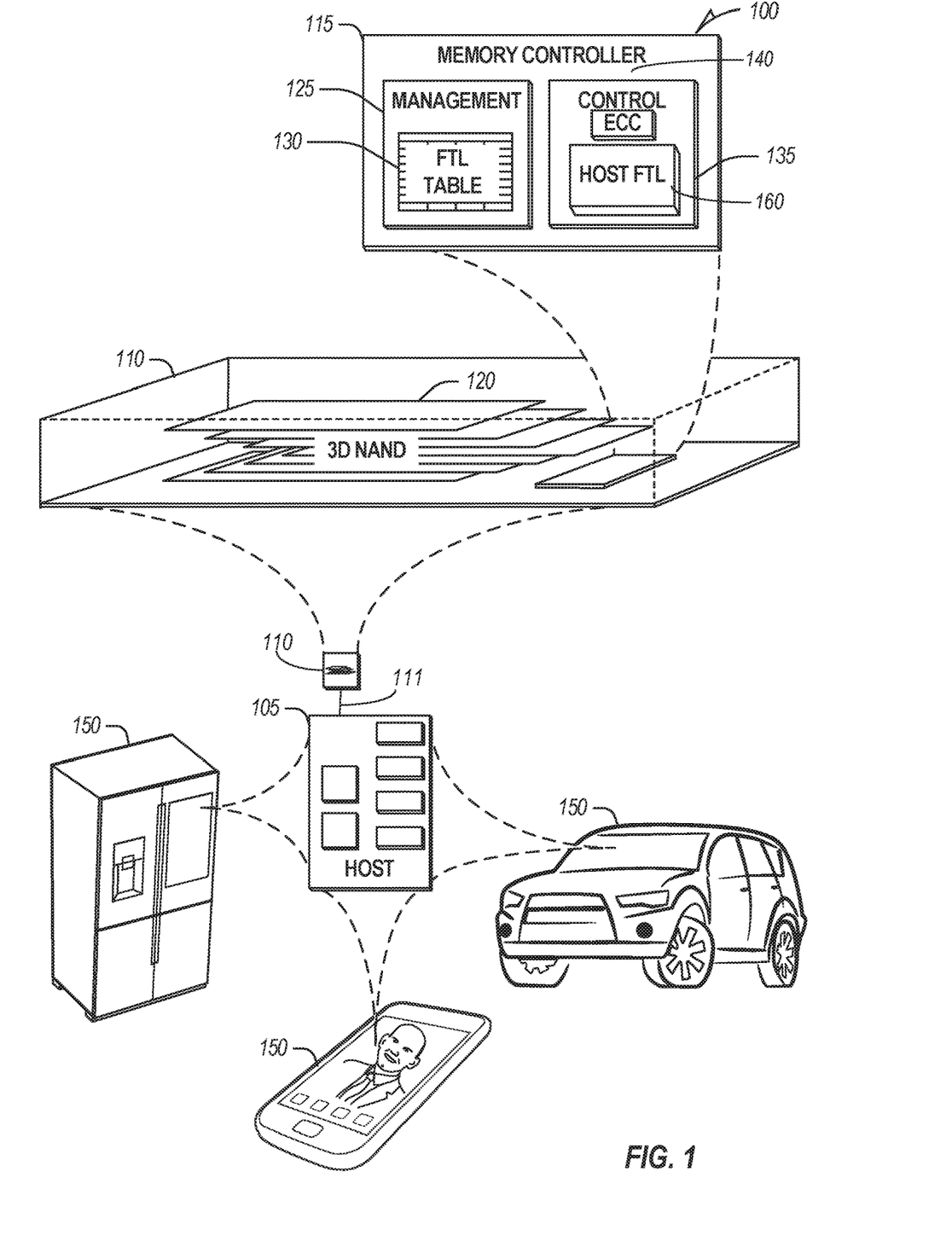
FIG. 1 illustrates an example system an environment including a memory device upon which one or more examples of the present subject matter may be implemented.

FIG. 1 illustrates an example of an environment 100 including a host 105 and a memory device 110 configured to communicate over a communication interface. The host 105 or the memory device 110 may be included in a variety of products 150, such as IoT devices (e.g., a refrigerator or other appliance, sensor, motor or actuator, mobile communication device, automobile, mobile phone, drone, etc.) to support processing, communications, or control of the product 150.

The memory device 110 includes a memory controller 115 and a memory array 120 including, for example, one or more individual memory die (e.g., a stack of three-dimensional (3D) NAND die). In 3D architecture semiconductor memory technology, vertical structures are stacked in multiple tiers, and coupled to form physical pages, to increase the storage density of a memory device (e.g., a storage device) in a given footprint (i.e. form factor). In an example, the memory device 110 can be a discrete memory device.

One or more communication interfaces 111 can be used to transfer data between the memory device 110 and one or more other components of the host 105, such as a Serial Advanced Technology Attachment (SATA) interface, a Peripheral Component Interconnect Express (PCIe) interface, a Universal Serial Bus (USB) interface, a UFS interface, an eMMC™ interface, or one or more other connectors or interfaces. The host 105 can include a host system, an electronic device, a processor, a memory card reader, or one or more other electronic devices external to the memory device 110. In some examples, the host 105 may be a machine having some portion, or all, of the components discussed in reference to the machine 400 of FIG. 4. Data may be transferred between the memory device 110 and other components over an input/output (I/O) bus that may include one or more latches for temporarily storing the data as it is being transferred (e.g., before being read or written from/to a memory array).

The memory controller 115 can receive instructions from the host 105, and can communicate with the memory array, such as to transfer data to (e.g., write or erase) or from (e.g., read) one or more of the memory cells, planes, sub-blocks, blocks, or pages of the memory array. The memory controller 115 can include, among other things, circuitry or firmware, including one or more components or integrated circuits. For example, the memory controller 115 can include one or more memory control units, circuits, control circuitries, or components configured to control access across the memory array 120 and to provide a translation layer between the host 105 and the memory device 110. The memory controller 115 can include one or more I/O circuits (and corresponding latches), caches, lines, or interfaces to transfer data to or from the memory array 120. The memory controller 115 can include a memory manager 125 and an array controller 135.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. ECC component 140, for example, may detect or compute a bit-error-rate (BER) associated with performing a number of memory operations. The BER may correspond to bit errors occurring in latches of an I/O bus, internal errors of memory controller 115, errors occurring in one or more of the NAND arrays, or any one or more of the multi-level cell(s) (MLC) of the memory device 110. The memory controller 115 can be configured to actively detect and recover from error occurrences (e.g., bit errors, operation errors, crash conditions, stalls, hang ups, etc.) associated with various operations or storage of data, while maintaining integrity of the data transferred between the host 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors. Array controller 135 may transmit detected BER information to memory manager 125 for storage and tracking. The memory controller 115 may include a command queue (not shown) that tracks memory commands received from a host. Commands in the queue may be executed by memory controller 115 in a first-in first-out (FIFO) manner, stack manner, out of sequence, according to priority, or in any other suitable order.

The described memory device 110 includes an host-resident FTL module 160 in association with the memory array 120. In some implementations, memory controller 115 of memory device 110 may include control circuitry configured to implement the functions of the host-resident FTL module 160. In other implementations, the host-resident FTL module 160 may include an independent control circuitry for implementing the described functionality. In yet other implementations, control circuitry may be divided between the host-resident FTL module 160 and memory controller 115 to implement the described functions of the host-resident FTL module 160. In the depicted example, the array controller 135 forms a portion of the memory controller 115, and the host-resident FTL module 160 forms a portion of the array controller. In other implementations, host-resident FTL module 160 may be external, and/or outside of array controller 135. For example, the host-resident FTL module 160 (or any individual components thereof), may be an independent component coupled to one or more components in environment 100. However physically located, the structures providing the additional functionality of the host-resident FTL module 160, function to verify physical addresses provided by the host 105 to prevent erroneous or malicious access to the memory device and to provide opportunities for the host to refresh the host-resident mapping table information to align the mapping information with the mapping information of the memory device during host-resident FTL operation of the environment 100.

The memory manager 125 can include, among other things, circuitry or firmware, such as a number of components or integrated circuits associated with various memory management functions. For purposes of the present description, example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection (e.g., BER monitoring) or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more components of the memory device 110 (e.g., various information associated with a memory array or one or more memory cells coupled to the memory controller 115 and can include an FTL table). For example, the management tables 130 can include information regarding FTL mapping information, block age, block erase count, error history, error parameter information, host reset timeout value, memory operation command latencies, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts (e.g., an error parameter) is above a threshold (e.g., an allowable error threshold), the bit error can be referred to as an uncorrectable bit error. The management tables 130 can maintain a count of correctable or uncorrectable bit errors, among other things.

The memory array 120 can include multiple memory cells arranged in, for example, a number of devices, planes, sub-blocks, blocks, or pages. As one example, a 48 GB TLC NAND memory device can include 18,592 bytes of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, may be selectively operated in SLC mode, or in a desired MLC mode (such as TLC, QLC, etc.).

In operation, data is typically written to or read from the memory device 110 in pages and erased in blocks. However, one or more memory operations (e.g., read, write, erase, etc.) can be performed on larger or smaller groups of memory cells, as desired. The data transfer size of a memory device 110 is typically referred to as a page, whereas the data transfer size of a host is typically referred to as a sector.

Different types of memory cells or memory arrays 120 can provide for different page sizes or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a MLC NAND flash device may have a higher bit error rate than a corresponding single-level cell (SLC) NAND flash device. As such, the MLC device may require more metadata bytes for error data than the corresponding SLC device.

Figure 2:
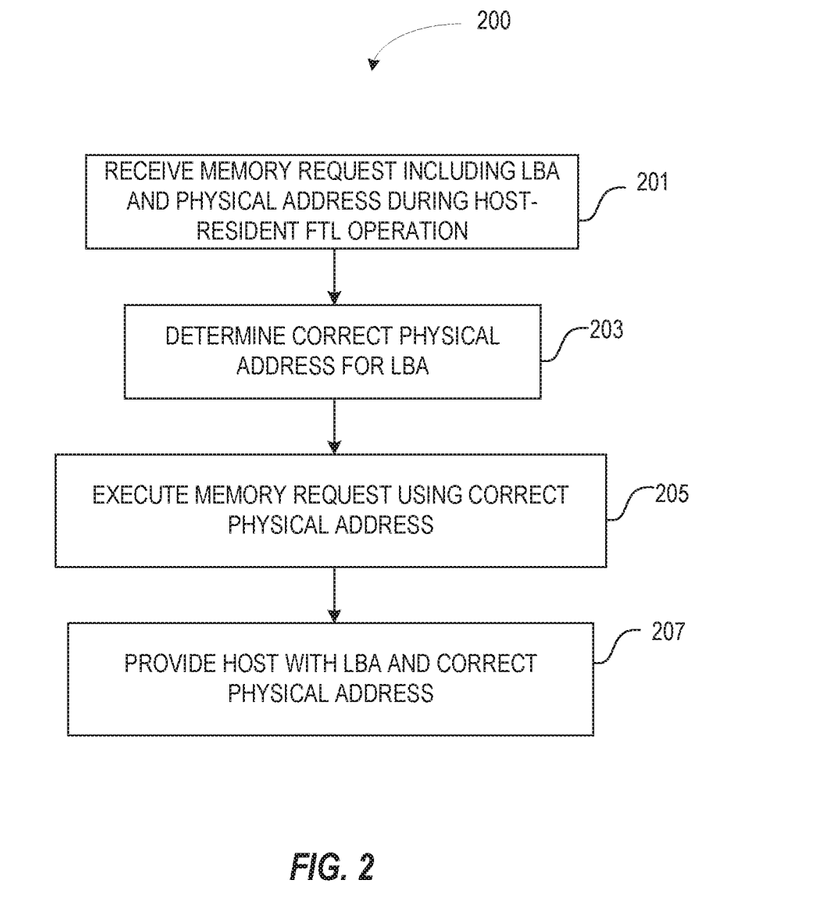
FIG. 2 illustrates generally a flowchart of an example method for implementing memory operations at a flash memory system using aspects of host-resident FTL.

FIG. 2 illustrates generally a flowchart of an example method 200 for implementing memory operations at a flash memory system using aspects of host-resident FTL. In certain examples, the method can assist in validating that the physical address received from the host corresponds to the LBA provided by the host. Without some form of verification, a malicious host can provide an LBA and an unrelated physical address that may result in accessing flash memory data not intended to be accessible by the host, or not intended to be accessed by the host using the particular host memory request received at the memory system. At 201, the memory system can receive a host memory request including an LBA and a physical address. At 203, the memory controller can determine the correct physical address corresponding to the LBA. In certain examples, the memory controller can first search the mapping table or portion thereof contained in the memory device cache using the LBA. If the memory device cache includes the LBA, the correct physical address can quickly be retrieved from the memory device cache. At 205, memory operation can proceed, such as retrieving data of the LBA at the physical address of the flash memory to fulfill a read request from the host, for example. At 207, the data can be returned to the host along with the LBA and the correct physical address. In certain examples, returning the correct physical address with LBA can assist the host in updating the mapping table resident in memory of the host.

In certain examples, if a portion, or piece, of the mapping table within the cache of the memory device does not include the LBA of the host request, the memory controller can assume the mapping table is up-to-date and, for example, retrieve the data at the physical address and return the data to the host. In some examples, if the portion of the mapping table within the cache of the memory device does not include the LBA of the host request, the memory controller can retrieve the portion of the mapping table from flash memory, retrieve the correct PA corresponding to the LBA, retrieve or access the data of the flash memory associated with PA, and return the data, or acknowledgement of flash memory access, along with the LBA and correct PA to the host.

In certain examples, validating the physical address passed by the host can ameliorate issues arising from the host mapping table not being coherent with the mapping table of the memory system as well as reducing the success of a malicious host accessing data not meant to be accessed. It is acknowledged that if the correct physical address is not available in the portion of the mapping table in the cache of the memory device, accessing the correct portion of the memory table from flash memory may contribute to operation latency. In addition, in certain examples, upon recognizing that the host supplied physical address asserted to correspond with the LBA is not coherent with the correct physical address of the memory system, the reply or acknowledgement to the host can include a chunk of updated mapping data. Retrieving and sending the updated chunk of mapping data can also contribute to operation latency especially if the updated mapping data is not cached at the memory system and is retrieved from flash memory.

Because updating the mapping table data of the host during memory operations can significantly affect overall system performance in some examples, providing updated mapping data to the host at each instance the memory system becomes aware of incoherency between the actual mapping table and the host mapping table is generally avoided. Continued failure to update the host mapping table would eventually render host-resident FTL meaningless, therefore, in certain examples, the memory system controller can keep an indication of each time host mapping data appears to be incorrect, and periodically update the host mapping table during idle modes of operation. In certain examples, the indication can be implemented using a counter, threshold count, a comparator, and logic to provide updated mapping table data to the host when the counter value satisfies the threshold count.

In certain examples, the indication can be implemented using multiple counters where each counter is associated to certain chunks of a flash memory mapping table. For example, a host system can target an area of memory for a period of time such that during that time the host mapping table can span at least a portion of the overall storage device LBA space. As an example, if a memory system includes 256 gigabyte (GB) of LBA storage space, during a host-resident FTL mode of operation, the host may target a 1 GB portion of the device LBA space. A typical mapping table entry can be 4 bytes of physical address for 4 KB of user data, so the mapping table for a 1 GB range can be 1 MB in size. If host-resident FTL update chunks are 16 KB in size, 64 such chunks can exist in a 1 MB mapping table range. In such an example system, the memory device can include 64 counters. Each counter can be associated with an LBA that defines a 16 Kb mapping chunk of data. If a host command includes the LBA but does not include a valid physical address, the counter can be triggered. It is understood that the actual numbers associated with a memory system, physical address storage, host-resident FTL update chunk size, etc. can differ from the numbers discussed in the above example without departing from the scope of the present subject matter.

If the counter value satisfies a threshold value, such as a maximum count threshold for an up counter or zero count threshold for a down counter, the memory device can schedule and execute transmission of updated mapping data to the host when a counter satisfies the threshold. In certain examples, all the counters can be reset periodically. In such examples, the memory device can delay a short amount of time (up to a threshold of invalid read command addresses) before triggering the relatively expensive host-resident FTL table update. The periodic reset of the counters can assure that updates only happen in high traffic scenarios (e.g., benchmarks), and that small amounts of host traffic will not trigger an update. A triggered host-resident FTL update, as discussed above, can provide superior performance over update implementations that update on each incorrect address.

In certain examples, the full memory capacity can span more than the targeted memory area and the memory system can include a finite number of counters. In such examples, the memory system can include a counter mapping table. The counter mapping table can identify a range of LBAs assigned to each of the finite number of counters as the counters are assigned. At some point, a physical address mismatch of a host request including a LBA can be detected and the memory system can identify a counter to count the physical address mismatch. If the identified counter is already assigned, the memory system can use the counter mapping table to identify if the LBA of the present host request is in the LBA range associated with the identified counter. If the LBA is within the LBA range, the identified counter is incremented. If the LBA is not within the LBA range associated with the identified counter, the counter is reset and a new LBA range can be assigned to the identified counter via the counter mapping table.

Figure 3:
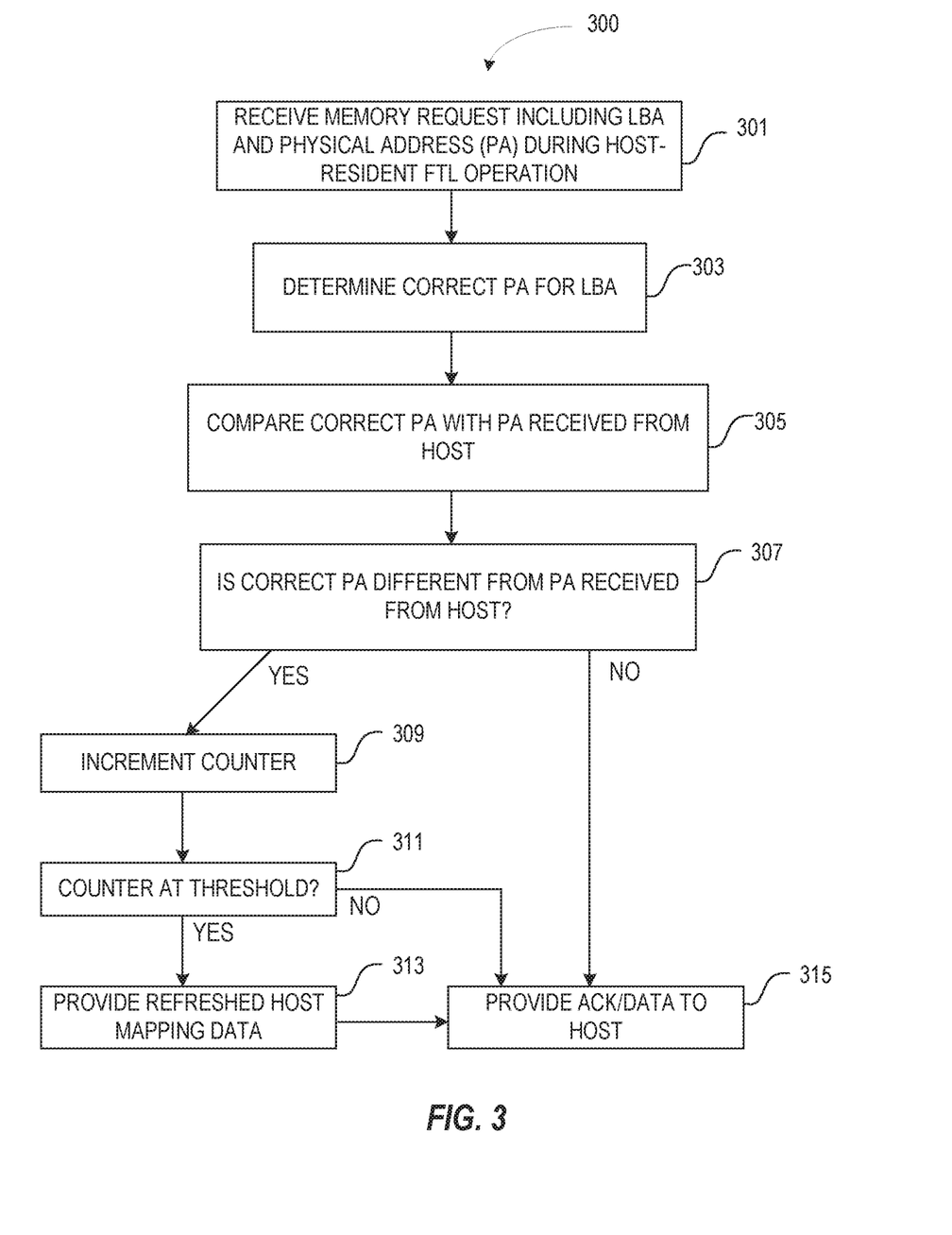
FIG. 3 illustrates generally a flowchart of an example method for efficiently monitoring and updating host mapping table data for host-resident FTL operation.

FIG. 3 illustrates generally a flowchart of an example method 300 for efficiently monitoring and updating host mapping table data for host-resident FTL operation. At 301, a memory request can be received at the memory device. Such a request can come from a host and can include a read memory request or a write memory request among other things. In host-resident FTL operation, the request can include a LBA associated with the host and a physical address assumed to be the location in the memory system corresponding to the data defined by the LBA. At 303, the memory system can use an internal mapping table to determine the correct PA associated with the LBA provided by the host. Once the correct PA is determined, the memory system can execute the request. In some examples, the request can be executed in parallel with the following operations. In some examples, the request can be executed serial with one or more of the following operations.

At 305, the correct PA can be compared with the PA received with the memory request. At 307, the result of the comparison can be evaluated. At 309, if the correct PA is different from the PA received with the memory request, a counter can be incremented. As used herein, incrementing a counter can include changing the counter by a value either up or down unless otherwise specified in more detail. At 311, the value of the counter can be compared to a threshold. At 313, if the value of the counter satisfies the threshold, refreshed host mapping data can be prepared or sent to the host. At 315, the memory system responds to the memory request with appropriate data or acknowledgment. The memory system can respond to the memory request after determining the correct PA is not different from the PA received with the memory request, after determining the counter does not satisfy the threshold, or before, simultaneous with, or after providing the refreshed host mapping data.

In certain examples, a counter can be assigned to a range of LBAs when a first discrepancy between a received LBA and received physical address is determined. If the number of counters is limited at the memory device, a counter mapping table can be established. In certain examples, the counter mapping table can associate an LBA range with a particular counter. Upon determining a new discrepancy between a received LBA and a received PA, a controller of the memory system can select a counter, determine the LBA range associated with the counter if the counter has already been assigned, and compare the LBA range with the new LBA associated with the new discrepancy. If the new LBA is within the LBA range the counter can be incremented. If the LBA is not within the LBA range of the counter, the memory controller can attempt to find another counter, or can reassign the present counter, reset the present counter, and save a new LBA range associated with the new LBA in the counter mapping table. In certain examples, the memory controller can align the counters with ranges of LBAs such that selecting a counter for a particular LBA can be the result of a simple division of the LBA.

In certain examples, the memory controller includes a timer used to reset all the counters. In some examples, the timer can be initiated on power up or on the memory device detecting initiation of the host-resident FTL feature. On timeout of the timer, the counters can be reset. This periodic reset prevents providing refreshed host mapping table data for LBAs that accumulate physical address discrepancies at a slow rate. It is assumed that mechanisms outside of the host-resident FTL feature can provide host mapping data updates in an efficient manner that will also take care to update ranges of LBAs that have not quickly accumulated PA discrepancies between the mapping information of the memory system and mapping data of the host.

Figure 4:
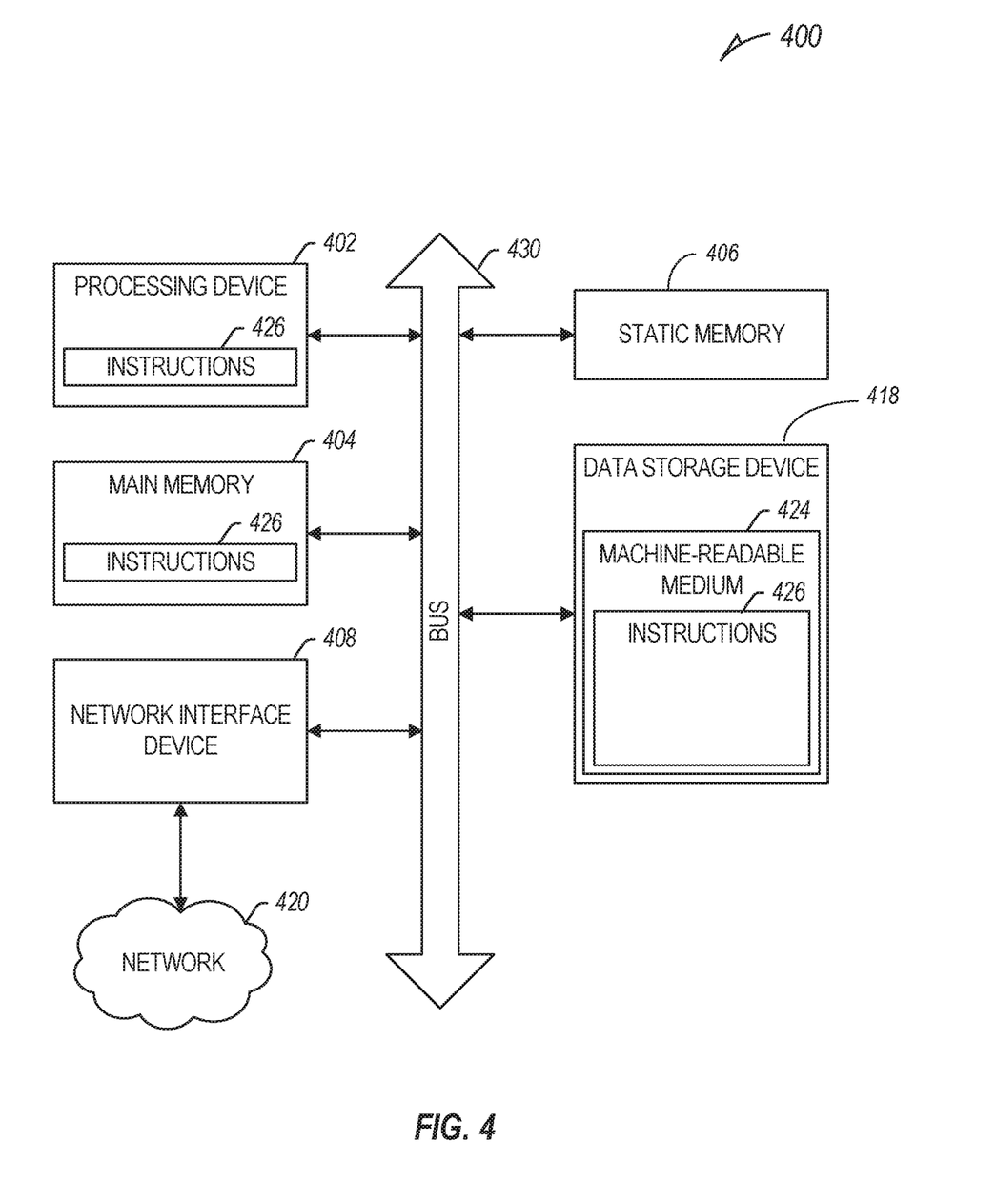
FIG. 4 illustrates a block diagram of an example machine upon which any one or more of the techniques (e.g., methodologies) discussed herein may perform.

FIG. 4 illustrates a block diagram of an example machine 400 upon which any one or more of the techniques (e.g., methodologies) discussed herein may perform. In alternative embodiments, the machine 400 may operate as a standalone device or may be connected (e.g., networked) to other machines. In a networked deployment, the machine 400 may operate in the capacity of a server machine, a client machine, or both in server-client network environments. In an example, the machine 400 may act as a peer machine in peer-to-peer (P2P) (or other distributed) network environment. The machine 400 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 400 (e.g., the host 105, the memory device 110, etc.) may include a processing device 402 (e.g., a hardware processor, a central processing unit (CPU), a graphics processing unit (GPU), a hardware processor core, or any combination thereof, such as a memory controller of the memory device 110, etc.), a main memory 404 (e.g., read-only memory (ROM), flash memory, dynamic random-access memory (DRAM) such as synchronous DRAM (SDRAM) or Rambus DRAM (RDRAM), etc.), a static memory 406 (e.g., static random-access memory (SRAM), cache, etc.), and a data storage system 418, some or all of which may communicate with each other via an interlink (e.g., bus) 430.

The processing device 402 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 402 can also be one or more special-purpose processing devices such as an application specific integrated circuit (ASIC), a field programmable gate array (FPGA), a digital signal processor (DSP), network processor, or the like. The processing device 402 can be configured to execute instructions 426 for performing the operations and steps discussed herein. The computer system 400 can further include a network interface device 408 to communicate over a network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 or within the processing device 402 during execution thereof by the computer system 400, the main memory 404 and the processing device 402 also constituting machine-readable storage media. The machine-readable storage medium 424, the data storage system 418, or the main memory 404 can correspond to the memory device 110 of FIG. 1.

In one implementation, the instructions 426 include instructions to implement functionality corresponding to one or more host-resident FTL operations discussed above with respect to FIG. 2 or FIG. 3. While the machine-readable storage medium 424 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 400 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 400 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 426 (e.g., software, programs, an operating system (OS), etc.) or other data are stored on the data storage device 418 can be accessed by the main memory 404 for use by the processing device 402. The main memory 404 (e.g., DRAM) is typically fast, but volatile, and thus a different type of storage than the data storage device 418 (e.g., an SSD), which is suitable for long-term storage, including while in an "off" condition. The instructions 426 or data in use by a user or the machine 400 are typically loaded in the main memory 404 for use by the processing device 402. When the main memory 404 is full, virtual space from the data storage device 418 can be allocated to supplement the main memory 404; however, because the data storage device 418 device is typically slower than the main memory 404, and write speeds are typically at least twice as slow as read speeds, use of virtual memory can greatly reduce user experience due to storage device latency (in contrast to the main memory 404, e.g., DRAM). Further, use of the data storage device 418 for virtual memory can greatly reduce the usable lifespan of the data storage device 418.

In contrast to virtual memory, virtual memory compression (e.g., the Linux™ kernel feature "ZRAM") uses part of the memory as compressed block storage to avoid paging to the data storage device 418. Paging takes place in the compressed block until it is necessary to write such data to the data storage device 418. Virtual memory compression increases the usable size of the main memory 404, while reducing wear on the data storage device 418.

Storage devices optimized for mobile electronic devices, or mobile storage, traditionally include MMC solid-state storage devices (e.g., micro Secure Digital (MicroSD™) cards, etc.). MMC devices include a number of parallel interfaces (e.g., an 8-bit parallel interface) with a host (e.g., a host device), and are often removable and separate components from the host. In contrast, eMMC™ devices are attached to a circuit board and considered a component of the host, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing network speeds, etc. In response to this demand, storage devices have shifted from parallel to serial communication interfaces. Universal Flash Storage (UFS) devices, including controllers and firmware, communicate with a host using a low-voltage differential signaling (LVDS) serial interface with dedicated read/write paths, further advancing greater read/write speeds.

The instructions 424 may further be transmitted or received over a network 420 using a transmission medium via the network interface device 408 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 408 may include one or more physical jacks (e.g., Ethernet, coaxial, or phone jacks) or one or more antennas to connect to the network 420. In an example, the network interface device 408 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 400, and includes digital or analog communications signals or other intangible medium to facilitate communication of such software.

ADDITIONAL NOTES AND EXAMPLES

Example 1 is a method comprising: receiving a memory operation request from a host at a non-volatile memory, the memory operation request including a logical block address (LBA) associated with the host and a physical address associated with the non-volatile memory; determining a correct physical address associated with the LBA using an address mapping stored on the non-volatile memory; comparing the correct physical address with the physical address received from the host; when the correct physical address is different than the physical address received from the host, incrementing a first counter at the non-volatile memory; comparing the first counter to a threshold value; and when the first counter is at or over the threshold value, providing a refreshed address mapping table to the host.

In Example 2, the subject matter of Example 1, wherein the providing a refreshed address mapping table to the host includes sending a mapping table chunk including the LBA from the non-volatile memory to the host.

In Example 3, the subject matter of any of Examples 1-2, wherein the memory operation request is a memory read request.

In Example 4, the subject matter of any of Examples 1-3, wherein the memory operation request is a memory write request.

In Example 5, the subject matter of any of Examples 1-4, including resetting the first counter after a predetermined amount of time to avoid refreshing the host for seldom encountered discrepancies.

In Example 6, the subject matter of any of Examples 1-5, including using a mathematical operation on the LBA to determine the first counter is associated with the LBA, wherein a quotient of a result of the mathematical operation is an index to the first counter.

In Example 7, the subject matter of any of Examples 1-6, wherein incrementing the first counter includes assigning the first counter with a range of LBAs and storing the range of LBAs assigned to the first counter in a counter assignment table on the non-volatile memory.

In Example 8, the subject matter of Example 7, including: receiving a second memory operation request from the host at the non-volatile memory, the second memory operation request including a second logical block address (LBA) associated with the host and a second physical address associated with the non-volatile memory; determining a second correct physical address associated with the second LBA using the address mapping table stored on the non-volatile memory; comparing the second correct physical address with the second physical address received from the host; when the second correct physical address is different than the second physical address received from the host:

using a modular mathematical operation on the second LBA to determine the first counter is associated with the second LBA.

In Example 9, the subject matter of Example 8, if the second LBA is within the range of LBAs assigned to the first counter, incrementing the first counter.

In Example 10, the subject matter of any of Examples 7-9, including: receiving a second memory operation request from the host at the non-volatile memory, the second memory operation request including a second logical block address (LBA) associated with the host and a second physical address associated with the non-volatile memory; determining a second correct physical address associated with the second LBA using the address mapping table stored on the non-volatile memory; comparing the second correct physical address with the second physical address received from the host; when the second correct physical address is different than the second physical address received from the host: using a modular mathematical operation on the second LBA to determine the first counter is associated with the second LBA.

In Example 11, the subject matter of Example 10, including: determining the second LBA is within the range of LBAs assigned to the first counter; and incrementing the first counter.

Example 12 is a memory device comprising: a cache configured to hold a portion of a mapping table of the memory device; flash memory configured to store and retrieve user data of a host, and to store the mapping table of the memory device; and a controller configured to: receive a memory operation request from a host, the memory operation request including a logical block address (LBA) associated with the host and a physical address associated with the flash memory; determine a correct physical address associated with the LBA using the mapping table; compare the correct physical address with the physical address received from the host; when the correct physical address is different than the physical address received from the host, incrementing a counter of the memory device; comparing the counter to a threshold value; and when the counter satisfies the threshold value, providing a refreshed portion of the mapping table to the host.

In Example 13, the subject matter of Example 12, wherein the refreshed portion of the mapping table includes a chunk of the mapping table including the LBA and the correct physical address.

In Example 14, the subject matter of any of Examples 12-13, wherein controller is further configured to assign the counter with a range of LBAs and store the range of LBAs assigned to the counter in a counter assignment table on the memory device.

In Example 15, the subject matter of Example 14, wherein the controller is further configured to: receive a second memory operation request from the host, the second memory operation request including a second LBA associated with the host and a second physical address associated with the flash memory; determine a second correct physical address associated with the second LBA using the mapping table of the flash memory; compare the second correct physical address with the second physical address received from the host; when the second correct physical address is different than the second physical address received from the host: execute a mathematical operation on the second LBA to determine a second counter associated with the second LBA; retrieve the range of LBAs assigned to the second counter from the counter assignment table; compare the second LBA with the range of LBAs assigned to the counter; if the second LBA is not within the range of LBAs assigned to the second counter: assign the second counter with a second range of LBAs and store the second range of LBAs assigned to the second counter in the counter assignment table; and reset the second counter.

In Example 16, the subject matter of Example 15, if the second LBA is within the range of LBAs assigned to the second counter, the controller is configured to increment the second counter.

In Example 17, the subject matter of any of Examples 15-16, wherein a quotient of the mathematical operation is an index to the second counter.

In Example 18, the subject matter of any of Examples 12-17, wherein the memory operation request is a memory read request.

In Example 19, the subject matter of any of Examples 12-18, wherein the memory operation request is a memory write request.

In Example 20, the subject matter of any of Examples 12-19, wherein the counter is reset after a predetermined amount of time independent of a value of the counter to avoid refreshing the host for seldom encountered discrepancies.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended. A system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

Method examples described herein can be machine, device, or computer-implemented at least in part. Some examples can include a computer-readable medium, a device-readable medium, or a machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A method comprising:
   receiving a memory operation request from a host at a non-volatile memory, the memory operation request including a logical block address (LBA) associated with the host and a physical address associated with the non-volatile memory;
   determining a correct physical address associated with the LBA using an address mapping stored on the non-volatile memory;
   comparing the correct physical address with the physical address received from the host;
   when the correct physical address is different than the physical address received from the host, incrementing a first counter at the non-volatile memory;
   comparing the first counter to a threshold value; and
   when the first counter is at or over the threshold value, providing a refreshed address mapping table to the host.

2. The method of claim 1, wherein the providing a refreshed address mapping table to the host includes sending a mapping table chunk including the LBA from the non-volatile memory to the host.

3. The method of claim 1, wherein the memory operation request is a memory read request.

4. The method of claim 1, wherein the memory operation request is a memory write request.

5. The method of claim 1, including resetting the first counter after a predetermined amount of time to avoid refreshing the host for seldom encountered discrepancies.

6. The method of claim 1, including using a mathematical operation on the LBA to determine the first counter is associated with the LBA, wherein a quotient of a result of the mathematical operation is an index to the first counter.

7. The method of claim 1, wherein incrementing the first counter includes assigning the first counter with a range of LBAs and storing the range of LBAs assigned to the first counter in a counter assignment table on the non-volatile memory.

8. The method of claim 7, including:
   receiving a second memory operation request from the host at the non-volatile memory, the second memory operation request including a second logical block address (LBA) associated with the host and a second physical address associated with the non-volatile memory;
   determining a second correct physical address associated with the second LBA using the address mapping table stored on the non-volatile memory;
   comparing the second correct physical address with the second physical address received from the host;
   when the second correct physical address is different than the second physical address received from the host:
   using a modular mathematical operation on the second LBA to determine the first counter is associated with the second LBA;
   retrieving the range of LBAs assigned to the first counter from the counter assignment table;

comparing the second LBA with the range of LBAs assigned to the first counter; and
if the second LBA is not within the range of LBAs assigned to the first counter:
assigning the first counter with a second range of LBAs and storing the second range of LBAs assigned to the first counter in the counter assignment table; and
resetting the first counter.

9. The method of claim 8, if the second LBA is within the range of LBAs assigned to the first counter, incrementing the first counter.

10. The method of claim 7, including:
receiving a second memory operation request from the host at the non-volatile memory, the second memory operation request including a second logical block address (LBA) associated with the host and a second physical address associated with the non-volatile memory;
determining a second correct physical address associated with the second LBA using the address mapping table stored on the non-volatile memory;
comparing the second correct physical address with the second physical address received from the host;
when the second correct physical address is different than the second physical address received from the host:
using a modular mathematical operation on the second LBA to determine the first counter associated with the second LBA;
retrieving the range of LBAs assigned to the first counter from the counter assignment table;
comparing the second LBA with the range of LBAs assigned to the first counter; and
if the second LBA is not within the range of LBAs assigned to the first counter:
assigning a second counter with a second range of LBAs and storing the second range of LBAs assigned to the second counter in the counter assignment table, wherein the second range of LBAs includes the second LBA; and
resetting the second counter.

11. The method of claim 10, including:
determining the second LBA is within the range of LBAs assigned to the first counter; and
incrementing the first counter.

12. A memory device comprising:
a cache configured to hold a portion of a mapping table of the memory device;
flash memory configured to store and retrieve user data of a host, and to store the mapping table of the memory device; and
a controller configured to:
receive a memory operation request from a host, the memory operation request including a logical block address (LBA) associated with the host and a physical address associated with the flash memory;
determine a correct physical address associated with the LBA using the mapping table;
compare the correct physical address with the physical address received from the host;
when the correct physical address is different than the physical address received from the host, incrementing a counter of the memory device;
comparing the counter to a threshold value; and
when the counter satisfies the threshold value, providing a refreshed portion of the mapping table to the host.

13. The memory device of claim 12, wherein the refreshed portion of the mapping table includes a chunk of the mapping table including the LBA and the correct physical address.

14. The memory device of claim 12, wherein the controller is further configured to assign the counter with a range of LBAs and store the range of LBAs assigned to the counter in a counter assignment table on the memory device.

15. The memory device of claim 14, wherein the controller is further configured to:
receive a second memory operation request from the host, the second memory operation request including a second LBA associated with the host and a second physical address associated with the flash memory;
determine a second correct physical address associated with the second LBA using the mapping table of the flash memory;
compare the second correct physical address with the second physical address received from the host;
when the second correct physical address is different than the second physical address received from the host:
execute a mathematical operation on the second LBA to determine a second counter associated with the second LBA;
retrieve the range of LBAs assigned to the second counter from the counter assignment table;
compare the second LBA with the range of LBAs assigned to the counter;
if the second LEA is not within the range of LBAs assigned to the second counter:
assign the second counter with a second range of LBAs and store the second range of LBAs assigned to the second counter in the counter assignment table; and
reset the second counter.

16. The memory device of claim 15, if the second LBA is within the range of LBAs assigned to the second counter, the controller is configured to increment the second counter.

17. The memory device of claim 15, wherein a quotient of the mathematical operation is an index to the second counter.

18. The memory device of claim 12, wherein the memory operation request is a memory read request.

19. The memory device of claim 12, wherein the memory operation request is a memory write request.

20. The memory device of claim 12, wherein the counter is reset after a predetermined amount of time independent of a value of the counter to avoid refreshing the host for seldom encountered discrepancies.

* * * * *